i
US006218234B1

United States Patent
Yu et al.

(10) Patent No.: US 6,218,234 B1
(45) Date of Patent: Apr. 17, 2001

(54) DUAL GATE AND DOUBLE POLY CAPACITOR ANALOG PROCESS INTEGRATION

(75) Inventors: Xing Yu; Shao Kai, both of Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/298,934

(22) Filed: Apr. 26, 1999

(51) Int. Cl.[7] .................................................. H01L 21/8242
(52) U.S. Cl. ........................... 438/241; 438/396; 438/398; 438/257
(58) Field of Search .................................... 438/239, 240, 438/241, 257, 238, 422, 396, 397, 398

(56) References Cited

U.S. PATENT DOCUMENTS

| | | | |
|---|---|---|---|
| 5,668,035 | 9/1997 | Fang et al. | 438/239 |
| 5,670,410 | 9/1997 | Pan | 437/60 |
| 5,843,817 | 12/1998 | Lee et al. | 438/239 |
| 5,858,831 | 1/1999 | Sung | 438/241 |
| 5,879,983 | * 3/1999 | Sewaga et al. | 438/257 |
| 5,953,599 | * 9/1999 | EltDiwany | 438/238 |
| 6,069,036 | * 5/2000 | Kim | 438/422 |

* cited by examiner

Primary Examiner—Charles Bowers
Assistant Examiner—Yennhu B. Huynh
(74) Attorney, Agent, or Firm—George O. Saile; RoseMary L. S. Pike

(57) ABSTRACT

A method for integrating the dual gate and double poly capacitor processes to fabricate an analog capacitor integrated circuit device is described. An isolation region is provided separating a first active area from a second active area in a semiconductor substrate. A first gate oxide layer is formed overlying the semiconductor substrate in both active areas. A first polysilicon layer is deposited overlying the first gate oxide layer and the isolation region. An capacitor dielectric layer comprising an oxide layer and a nitride layer is deposited overlying the first polysilicon layer. The capacitor dielectric layer and first polysilicon layer are etched away where they are not covered by a mask to form a first polysilicon gate electrode in the first area and a polysilicon capacitor bottom plate and overlying capacitor dielectric overlying the isolation region. The first gate oxide layer is removed in the second area and a thinner second gate oxide layer is formed in the second area. A second polysilicon layer is deposited overlying the second gate oxide layer, bottom capacitor plate and capacitor dielectric, and the first polysilicon gate electrode. The second polysilicon layer is etched away where it is not covered by a mask to form a second polysilicon gate electrode in the second area and to form a top capacitor plate overlying the bottom capacitor plate having the capacitor dielectric layer therebetween.

23 Claims, 4 Drawing Sheets

US 6,218,234 B1

DUAL GATE AND DOUBLE POLY CAPACITOR ANALOG PROCESS INTEGRATION

BACKGROUND OF THE INVENTION

1. Field of the Invention

The present invention relates to a method of fabricating an analog capacitor integrated circuit device, and more particularly, to a method of forming an analog capacitor integrated circuit device in which the double polysilicon capacitor and dual gate processes are combined.

2. Description of the Prior Art

Capacitors are critical components in the integrated circuit devices of today. For example, in analog integrated circuit devices, capacitors play an important role. High value resistors are not necessary in analog capacitor applications. Conventionally, the double poly capacitor process to make an analog capacitor and the dual gate process are separate modules. First, a thin gate oxide is formed, then the thick gate oxide is formed. The thick gate oxide formation typically involves two oxidation steps and photoresist stripping steps. The thick gate oxide resulting from this process may have poor integrity. After transistor formation, the capacitor process module is inserted, having capacitor dielectric and polysilicon depositions to form the capacitor plate and resistor. The additional thermal budget used for the capacitor and resistor will impact the transistors. It is desired to simplify the existing process and to modify the design for the polysilicon layer and capacitor mask so that the dual gate and double poly capacitor modules can be integrated in the analog capacitor process.

U.S. Pat. Nos. 5,843,817 to Lee et al and 5,858,831 to Sung teach logic and embedded memory integration methods. U.S. Pat. No. 5,668,035 to Fang et al teaches a dual gate process. U.S. Pat. No. 5,670,410 to Pan teaches fabrication of an analog capacitor using an oxide capacitor dielectric layer. None of these patents show the integration of dual gate and double poly capacitor processes for an analog capacitor integrated circuit device.

SUMMARY OF THE INVENTION

Accordingly, it is a primary object of the invention to provide an effective and very manufacturable process for fabricating an analog capacitor.

Another object of the present invention is to provide a method for integrating the dual gate and double poly capacitor processes to fabricate an analog capacitor integrated circuit device.

In accordance with the objects of this invention, a method for integrating the dual gate and double poly capacitor processes to fabricate an analog capacitor integrated circuit device is achieved. An isolation region is provided separating a first active area from a second active area in a semiconductor substrate. A first gate oxide layer is formed overlying the semiconductor substrate in the first and second active areas. A first polysilicon layer is deposited overlying the first gate oxide layer and the isolation region. An oxide layer is deposited overlying the first polysilicon layer. A nitride layer is deposited overlying the oxide layer. The nitride layer, oxide layer, and first polysilicon layer are etched away where they are not covered by a mask to form a first polysilicon gate electrode in the first area and to form a polysilicon capacitor bottom plate and overlying capacitor dielectric comprising the oxide and nitride layers overlying the isolation region. The first gate oxide layer is removed in the second area. A second gate oxide layer is formed in the second area wherein the second gate oxide layer has a thickness less than the thickness of the first gate oxide layer. A second polysilicon layer is deposited overlying the second gate oxide layer, bottom capacitor plate and capacitor dielectric, and the first polysilicon gate electrode. The second polysilicon layer is etched away where it is not covered by a mask to form a second polysilicon gate electrode in the second area and to form a top capacitor plate overlying the bottom capacitor plate having the capacitor dielectric layer therebetween.

BRIEF DESCRIPTION OF THE DRAWINGS

In the following drawings forming a material part of this description, there is shown.

DESCRIPTION OF THE PREFERRED EMBODIMENTS

Figure 1:
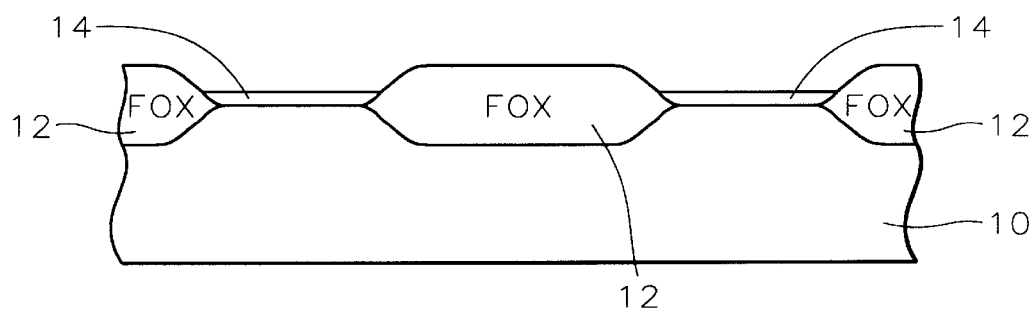
FIGS. 1 through 11 are schematic cross-sectional representations of a preferred embodiment of the present invention.

The dual gate and double poly analog capacitor process will now be described with reference to FIGS. 1–11. Referring now more particularly to FIG. 1, there is shown a partially completed integrated circuit device. The semiconductor substrate 10 is preferably composed of silicon having a (100) crystallographic orientation. Isolation regions are formed to separate active areas from one another. For example, Filed OXide regions 12 are formed in the semiconductor substrate as shown in FIG. 1. Next, the semiconductor substrate is oxidized, as conventional in the art, to form the thick gate oxide layer 14 having a thickness of between about 100 and 120 Angstroms.

Figure 2:
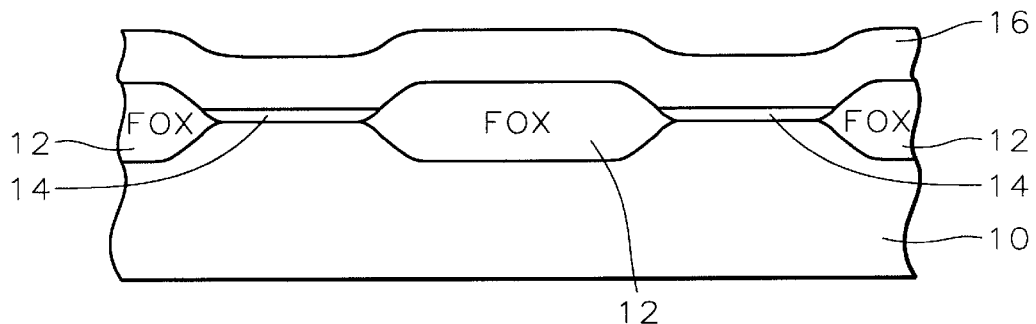

A first polysilicon layer 16 is blanket deposited over the surface of the substrate overlying the thick gate oxide 14 and the field oxide regions 12. The polysilicon layer is typically deposited by low pressure chemical vapor deposition (LPCVD), as illustrated in FIG. 2, to a thickness of between about 2500 and 3000 Angstroms and doped with phosphorus. This first polysilicon layer will form the bottom capacitor plate and the transistor overlying the thick oxide. For example, this might be a 5 volt CMOS transistor.

Figure 3:
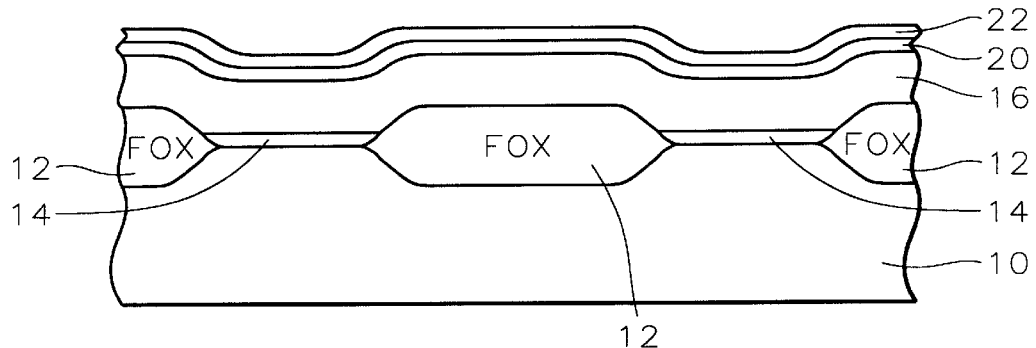

Referring to FIG. 3, an oxide layer 20 is deposited over the first polysilicon layer to a thickness of between about 100 and 200 Angstroms. A nitride layer 22 is deposited over the oxide layer to a thickness of between about 100 and 150 Angstroms. Alternatively, this dielectric layer may be an ONO layer comprising a first layer of oxide having a thickness of between about 100 and 200 Angstroms, a second layer of nitride having a thickness of between about 100 and 150 Angstroms, and a third layer of oxide having a thickness of between about 100 and 200 Angstroms.

Figure 4:
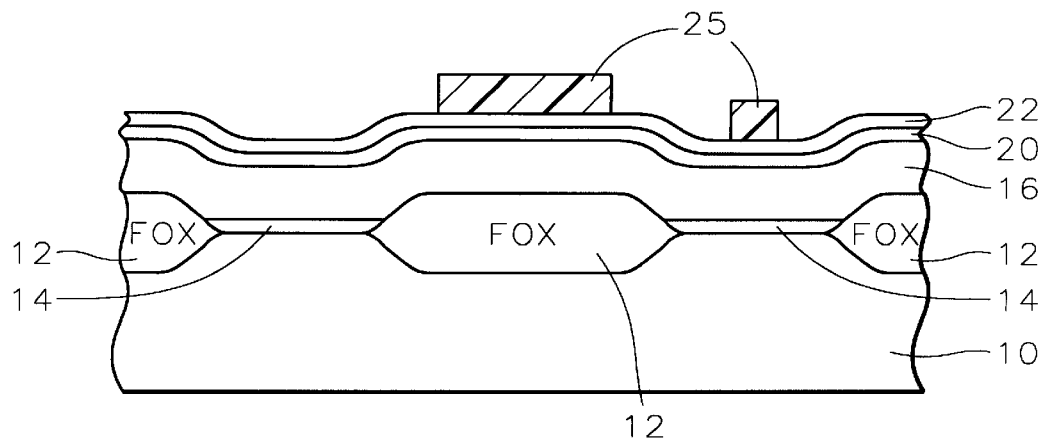
Figure 5:
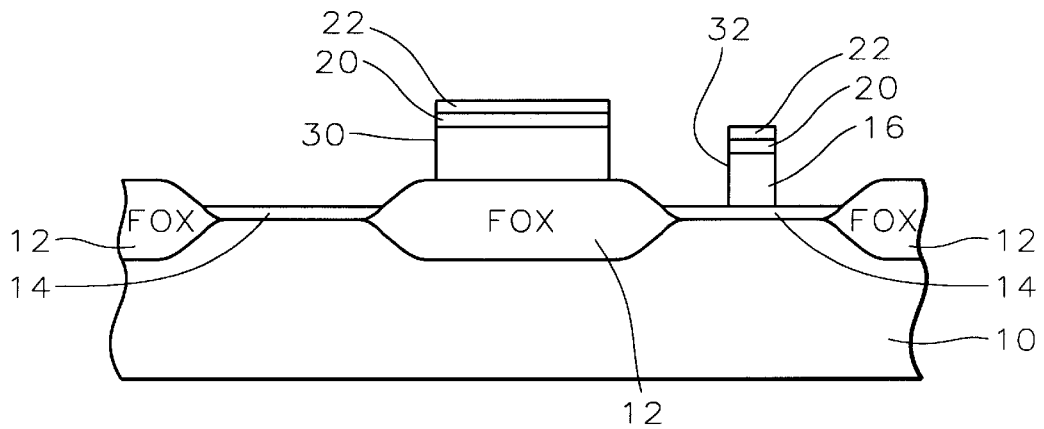

A photoresist layer is coated over the substrate and patterned using conventional lithography to form the photomask 25, shown in FIG. 4. The first polysilicon layer 16 and the dielectric layers 20 and 22 are etched away where they are not covered by the photomask 25. As shown in FIG. 5, this etching forms the bottom capacitor plate 30 overlying the field oxide region 12 with the capacitor dielectric layer 20/22 overlying capacitor plate 30. Transistor 32 is also formed in one of the active areas of the substrate overlying the thick gate oxide 14.

By using a single mask for making both the capacitor bottom plate with overlying capacitor dielectric and the thick oxide transistor, the process is simplified.

Figure 6:
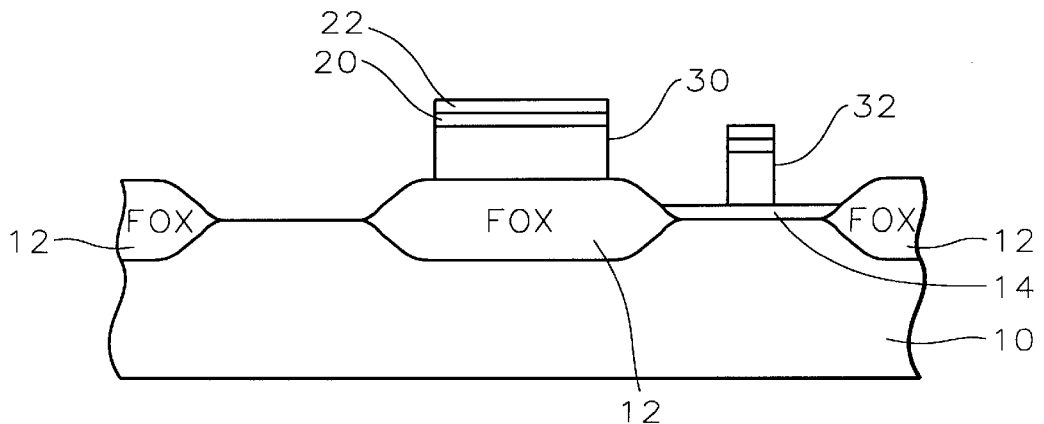
Figure 7:
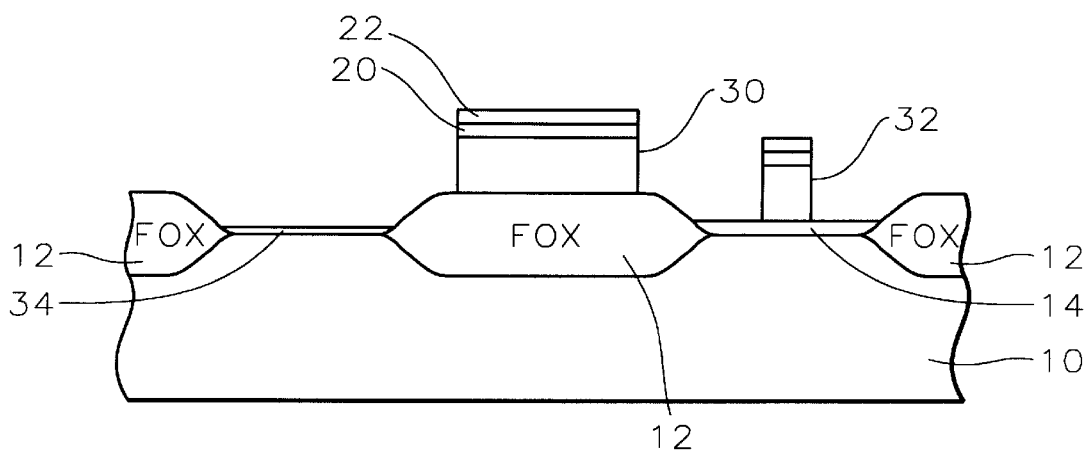

Now, the thick gate oxide layer 14 is removed in the other active area on the left side of FIG. 6. A thin gate oxide is grown on the semiconductor substrate, as shown in FIG. 7, in the area where the thick gate oxide has been removed. The thin gate oxide 34 has a thickness of between about 50 and 70 Angstroms. The quality of the thick oxide 14 under the transistor 32 is preserved because the polysilicon layer 16 protects the underlying oxide.

Figure 8:
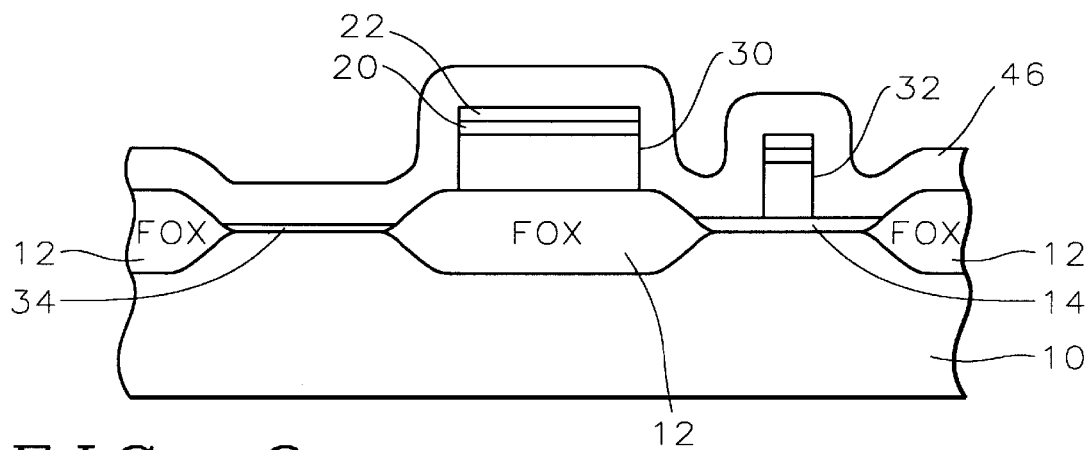
Figure 9:
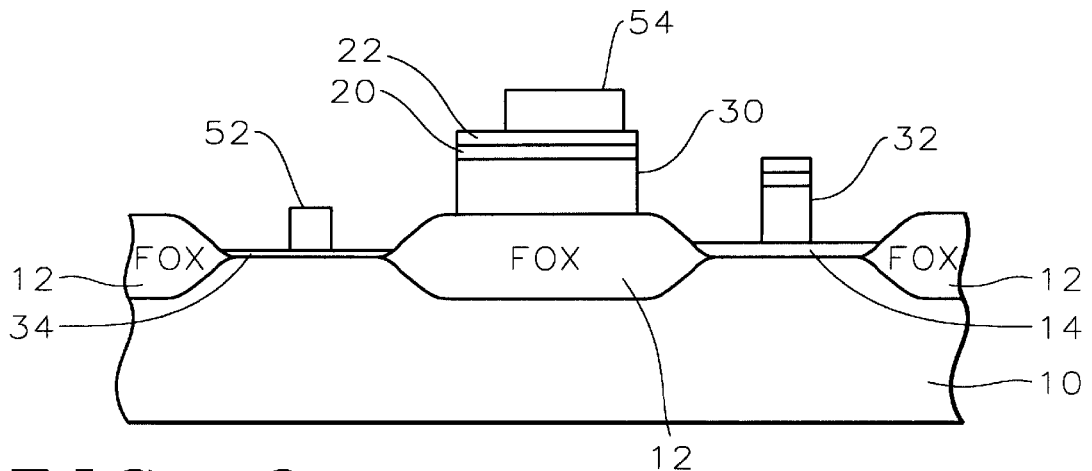

Referring now to FIG. 8, a second polysilicon layer 46 is deposited over the substrate by LPCVD to a thickness of between about 2500 and 3000 Angstroms. A second layer of photoresist is coated over the substrate and patterned to form a mask, not shown. The second polysilicon layer is etched away where it is not covered by the mask to form the thin gate transistor 52 and the top plate capacitor electrode 54, as shown in FIG. 9.

This completes the dual gate process and the double poly capacitor process. The integration of the two processes simplifies the process while achieving a good quality thick gate oxide, and requiring no additional process steps or thermal budget for forming the analog capacitor 54/30.

Figure 10:
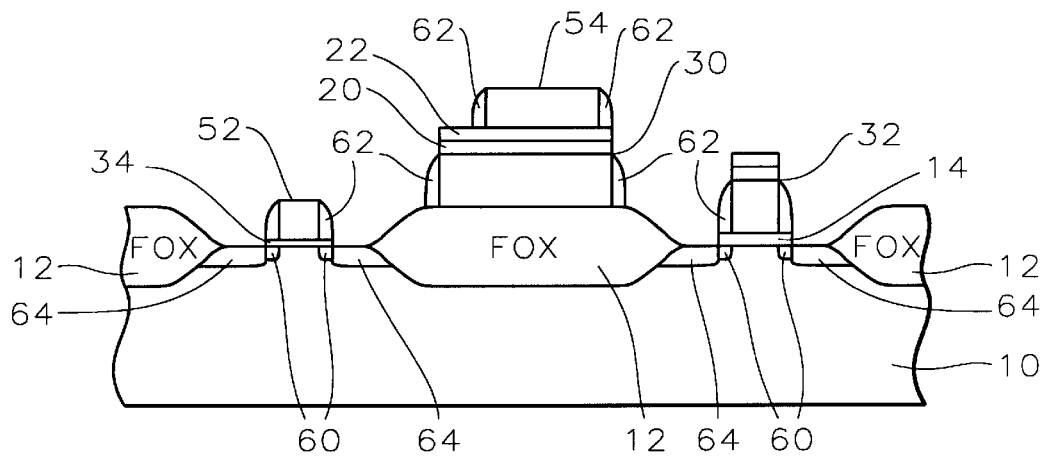

Processing continues as is conventional in the art to complete the integrated circuit device. For example, as shown in FIG. 10, lightly doped regions 60 are formed within the semiconductor substrate adjacent to the transistors 32 and 52. Spacers 62, comprising silicon oxide or silicon nitride, for example, are formed on the sidewalls of the transistors 32 and 52 and on the sidewalls of the bottom and top plate electrodes 30 and 54, respectively. Source and drain regions 64 are then formed within the semiconductor substrate associated with the transistors 32 and 52, as is conventional in the art.

Figure 11:
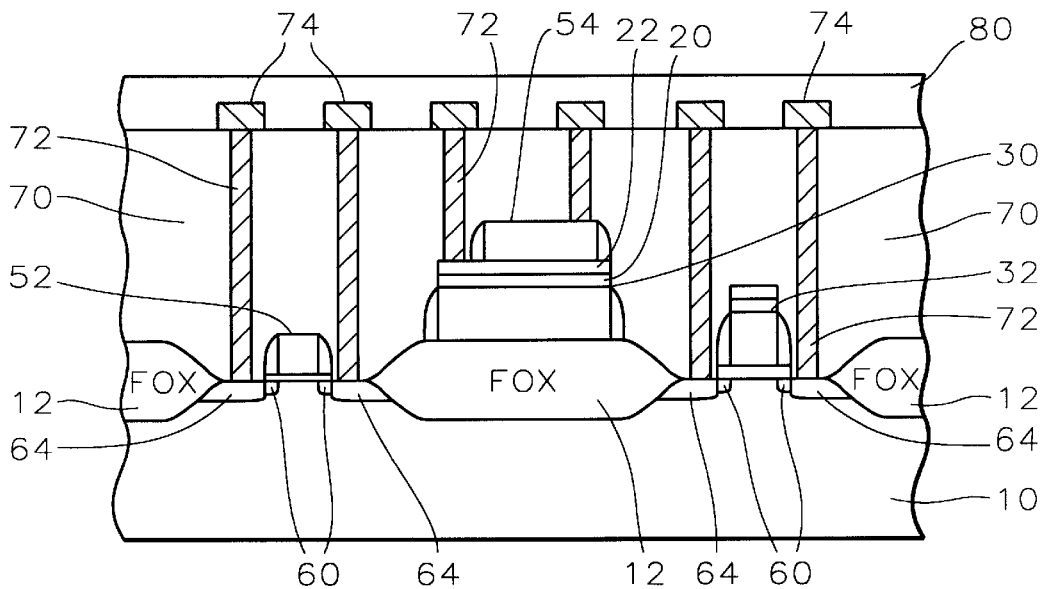

Referring now to FIG. 11, a thick insulating layer 70 is blanket deposited over the substrate. This layer 70 may comprise silicon oxide, borophosphosilicate glass (BPSG), borophospho-TEOS oxide, SABPSG, or the like and has a thickness of between about 10,000 and 12,000 Angstroms. Contact openings are made through the insulating layer to the substrate over the source and drain regions or to the capacitor, as shown. The openings are filled with a conducting layer, such as tungsten plugs 72. Another conducting layer 74, such as aluminum or an aluminum alloy, is deposited and patterned to complete the contacts as shown. A passivation layer, such as silicon nitride layer 80, completes the integrated circuit device.

The process of the invention results in the fabrication of an analog capacitor. The integration of the dual gate and the double poly capacitor processes results in a simple process with fewer steps and lower thermal budget than the conventional process. A high quality gate oxide is formed for both the thin and thick gate transistors, as well as a high quality NO or ONO capacitor dielectric. The invention uses a single mask for patterning both the transistor and the capacitor plate.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an analog capacitor integrated circuit device comprising:

providing an isolation region separating a first active area from a second active area in a semiconductor substrate;

providing a first gate oxide layer overlying said semiconductor substrate in said first and second active areas;

depositing a first polysilicon layer overlying said first gate oxide layer and said isolation region;

depositing an oxide layer overlying said first polysilicon layer;

depositing a nitride layer overlying said oxide layer;

thereafter etching away said nitride layer, said oxide layer, and said first polysilicon layer where they are not covered by a mask to form a first polysilicon gate electrode in said first active area and to form a polysilicon capacitor bottom plate and overlying capacitor dielectric comprising said oxide layer and said nitride layer overlying said isolation region;

thereafter removing said first gate oxide layer in said second active area and forming a second gate oxide layer overlying said semiconductor substrate in said second active area wherein said second gate oxide layer has a thickness less than the thickness of said first gate oxide layer;

depositing a second polysilicon layer overlying said second gate oxide layer, said bottom capacitor plate and capacitor dielectric, and said first polysilicon gate electrode;

thereafter etching away said second polysilicon layer where it is not covered by a mask to form a second polysilicon gate electrode in said second active area and to form a top capacitor plate overlying said bottom capacitor plate having said capacitor dielectric layer therebetween; and completing said analog capacitor integrated circuit device.

2. The method according to claim 1 wherein said isolation region is a field oxide region.

3. The method according to claim 1 wherein said first gate oxide layer has a thickness of between about 100 and 120 Angstroms.

4. The method according to claim 1 wherein said first polysilicon layer has a thickness of between about 2500 and 3000 Angstroms.

5. The method according to claim 1 wherein said oxide layer comprises silicon oxide and has a thickness of between about 100 and 200 Angstroms.

6. The method according to claim 1 wherein said nitride layer comprises silicon nitride and has a thickness of between about 100 and 150 Angstroms.

7. The method according to claim 1 further comprising depositing a second silicon oxide layer overlying said nitride layer wherein said second silicon oxide layer has a thickness of between about 100 and 120 Angstroms.

8. The method according to claim 1 wherein said second gate oxide layer has a thickness of between about 50 and 70 Angstroms.

9. The method according to claim 1 wherein said second polysilicon has a thickness of between about 2500 and 3000 Angstroms.

10. The method according to claim 1 further comprising:

forming source and drain regions in said semiconductor substrate adjacent to said first and second gate electrodes;

depositing an insulating layer overlying said semiconductor substrate, said first and second gate electrodes, and said bottom and top capacitor plates;

opening contact holes through said insulating layer to underlying said source and drain regions and to said top and bottom capacitor plates;

filling said contact holes with a conducting layer and patterning said conducting layer; and depositing a passivation layer overlying patterned said conducting layer to complete said analog capacitor integrated circuit device.

11. A method for fabricating an analog capacitor integrated circuit device comprising:

providing an isolation region separating a first active area from a second active area in a semiconductor substrate;

providing a first gate oxide layer overlying said semiconductor substrate in said first and second active areas;

depositing a first polysilicon layer overlying said first gate oxide layer and said isolation region;

depositing an oxide layer overlying said first polysilicon layer;

depositing a nitride layer overlying said oxide layer;

thereafter etching away said nitride layer, said oxide layer, and said first polysilicon layer where they are not covered by a mask to form a first polysilicon gate electrode in said first active area and to form a polysilicon capacitor bottom plate and overlying capacitor dielectric comprising said oxide layer and said nitride layer overlying said isolation region;

thereafter removing said first gate oxide layer in said second active area and forming a second gate oxide layer overlying said semiconductor substrate in said second active area wherein said second gate oxide layer has a thickness less than the thickness of said first gate oxide layer;

depositing a second polysilicon layer overlying said second gate oxide layer, said bottom capacitor plate and capacitor dielectric, and said first polysilicon gate electrode;

thereafter etching away said second polysilicon layer where it is not covered by a mask to form a second polysilicon gate electrode in said second active area and to form a top capacitor plate overlying said bottom capacitor plate having said capacitor dielectric layer therebetween;

forming source and drain regions in said semiconductor substrate adjacent to said first and second gate electrodes;

depositing an insulating layer overlying said semiconductor substrate, said first and second gate electrodes, and said bottom and top capacitor plates;

opening contact holes through said insulating layer to underlying said source and drain regions and to said top and bottom capacitor plates;

filling said contact holes with a conducting layer and patterning said conducting layer; and depositing a passivation layer overlying patterned said conducting layer to complete said analog capacitor integrated circuit device.

12. The method according to claim 11 wherein said isolation region is a field oxide region.

13. The method according to claim 11 wherein said first gate oxide layer has a thickness of between about 100 and 120 Angstroms.

14. The method according to claim 11 wherein said first polysilicon layer has a thickness of between about 2500 and 3000 Angstroms.

15. The method according to claim 11 wherein said oxide layer comprises silicon oxide and has a thickness of between about 100 and 200 Angstroms.

16. The method according to claim 11 wherein said nitride layer comprises silicon nitride and has a thickness of between about 100 and 150 Angstroms.

17. The method according to claim 11 further comprising depositing a second silicon oxide layer overlying said nitride layer wherein said second silicon oxide layer has a thickness of between about 100 and 200 Angstroms.

18. The method according to claim 11 wherein said second gate oxide layer has a thickness of between about 50 and 70 Angstroms.

19. The method according to claim 11 wherein said second polysilicon has a thickness of between about 2500 and 3000 Angstroms.

20. A method for fabricating an analog capacitor integrated circuit device comprising:

providing an field oxide region separating a first active area from a second active area in a semiconductor substrate;

providing a first gate oxide layer overlying said semiconductor substrate in said first and second active areas wherein said first oxide layer has a thickness of between about 100 and 120 Angstroms;

depositing a first polysilicon layer overlying said first gate oxide layer and said field oxide region;

depositing a capacitor dielectric layer overlying said first polysilicon layer;

thereafter etching away said capacitor dielectric layer and said first polysilicon layer where they are not covered by a mask to form a first polysilicon gate electrode in said first active area and to form a polysilicon capacitor bottom plate and overlying capacitor dielectric layer overlying said field oxide region;

thereafter removing said first gate oxide layer in said second active area and forming a second gate oxide layer overlying said semiconductor substrate in said second active area wherein said second gate oxide layer has a thickness of between about 50 and 70 Angstroms;

depositing a second polysilicon layer overlying said second gate oxide layer, said bottom capacitor plate and capacitor dielectric, and said first polysilicon gate electrode;

thereafter etching away said second polysilicon layer where it is not covered by a mask to form a second polysilicon gate electrode in said second active area and to form a top capacitor plate overlying said bottom capacitor plate having said capacitor dielectric layer therebetween; and completing said analog capacitor integrated circuit device.

21. The method according to claim 20 wherein said capacitor dielectric layer comprises:

a first layer of silicon oxide having a thickness of between about 100 and 200 Angstroms; and a second layer of silicon nitride having a thickness of between about 100 and 150 Angstroms.

22. The method according to claim 20 wherein said capacitor dielectric layer comprises:

a first layer of silicon oxide having a thickness of between about 100 and 200 Angstroms;

a second layer of silicon nitride having a thickness of between about 100 and 150 Angstroms; and a third layer of silicon oxide having a thickness of between about 100 and 200 Angstroms.

23. The method according to claim 20 further comprising:

forming source and drain regions in said semiconductor substrate adjacent to said first and second gate electrodes;

depositing an insulating layer overlying said semiconductor substrate, said first and second gate electrodes, and said bottom and top capacitor plates;

opening contact holes through said insulating layer to underlying said source and drain regions and to said top and bottom capacitor plates;

filling said contact holes with a conducting layer and patterning said conducting layer; and depositing a passivation layer overlying patterned said conducting layer to complete said analog capacitor integrated circuit device.

* * * * *